United States Patent [19]

Okabe et al.

[11] 4,392,228

[45] Jul. 5, 1983

[54] TERRACED SUBSTRATE SEMICONDUCTOR LASER

[75] Inventors: Takako Okabe, Kusatsu; Kunio Itoh, Uji; Takashi Sugino, Takatsuki, all of Japan

[73] Assignee: Matsushita Electric Industrial Co., Ltd., Kadoma, Japan

[21] Appl. No.: 262,773

[22] Filed: May 11, 1981

[30] Foreign Application Priority Data

May 16, 1980 [JP] Japan .................................. 55-65554

[51] Int. Cl.³ ............................................. H01S 3/19
[52] U.S. Cl. ......................................... 372/46; 357/17
[58] Field of Search ................ 372/44, 45, 46; 357/17

[56] References Cited

U.S. PATENT DOCUMENTS 4,329,661 5/1982 Sugino et al. ......................... 372/46

Primary Examiner—James W. Davie
Attorney, Agent, or Firm—Cushman, Darby & Cushman

[57] ABSTRACT

A terraced semiconductor laser comprising semiconductor layers (10, 11, 12) including an active layer (11) formed on a terraced semiconductor substrate (9) in a manner to have an inclined part (111) ranging from the position above said step to the part shifted to the side of said thinner part, an overriding layer (13) having the opposite conductivity type to that of the uppermost layer (12) of said semiconductor layers (10, 11, 12) and formed on said uppermost layer (12), characterized by further comprising:

a last layer (14) having the same conductivity type to that of the overriding layer (13) formed on the latter layer (13), said last layer (14) having a stripe-shaped through-opening (141) at the position which is a shifted position from the part immediately above said inclined part 111, thereby exposing a surface of said overriding layer (13) at the bottom of the through-opening (141), a conduction region (15) formed at least on the bottom and side faces of said stripe-shaped opening, in a manner to reach and contact said uppermost layer (12), a first electrode layer formed to contact to said conduction layer in said through-opening and a second electrode formed on the bottom face of said terraced semiconductor substrate. Short-circuiting of p-n junction is eliminated by the improved structure.

10 Claims, 7 Drawing Figures

TERRACED SUBSTRATE SEMICONDUCTOR LASER

BACKGROUND OF THE INVENTION

1. Field of the Invention

The present invention relates to a semiconductor laser of terraced substrate type.

2. Description of the Prior Art

Semiconductor laser has advantages of smallness in bulk, high efficiency and direct modulation by means of its current. As a result of drastical development of the semiconductor lasers in recent years, the lasers have become widely considered to be used as light sources for various kinds of apparatus such as for light communication, video-disk recording and prproducing, audio disk playing laser printing, hologram, and etc. For most of these uses, it is strongly requested that the oscillation of the semiconductor laser being a single transverse mode.

The conventional stripe type laser has a structure of lasing region of simple gain guiding, which does not have a particular structure to confine light in one part of the active layer, but the oscillation is likely to be carried out in the whole width of the active layer. Therefore, the conventional laser has had a difficulty in maintaining a transverse mode for a wide range of current, and therefore has been liable to occurrence of undesirable mode conversion or a generation of higher modes. As a result of these, the light-current characteristic of the conventional laser has been likely to have a kink of characteristic curve or the device has been likely to have a multiple longitudinal mode oscillation.

In order to solve such problem, there has been proposed special type semiconductor laser structure named terrace-substrate type (TS type) laser, and many improvements have been proposed. Among the proposed improvements of the TS type lasers, such improved structure as shown by FIG. 1 has been proposed in the Japanese Patent Application No. Sho 55-13159 and corresponding U.S. Pat. Ser. No. 224,821, Canadian Patent Application No. 368,427 and European Patent Application No. 81100192.4, neither of them is disclosed or published yet. The laser of the abovementioned proposed invention has a double-hetero structure, as shown in FIG. 1, which has on

- a terraced substrate 1 of . . . n-GaAs
- a first clad layer 2 of . . . n-GaAlAs,
- an active layer 3 of . . . non-doped GaAlAs,
- a second clad layer 4 of . . . p-GaAlAs and
- a cap layer 5 of . . . n-GaAs, wherethrough a Zn diffused p-type current injection region 6 is formed in a manner that its diffusion front slightly goes down into the underlying second clad layer 4. A p-side electrode 7 is formed on the cap layer 5 forming the ohmic contact to the current injection region 6. The cap layer 5 of n-GaAs and the underlying second clad layer 4 of p-GaAlAs form an isolation junction inbetween except the part of the current injection region 6.

Such type of the TS type laser can effectively confine laser oscillation light in the oblique active region of the GaAlAs active layer 3 formed at the vicinity of the step part of the terraced substrate 1, and furthermore the current injection region is also effectively limited by the width of contact between the diffused region 6 and the second clad layer 4. Therefore, the abovementioned laser can stably oscillate at the single mode and low threshold current.

Hereupon, in order to effectively radiate the heat produced at the active layer 3, generally the semiconductor lasers are bonded on a heat sink by the top side electrode 7, which is closer to the active layer 3, not by the bottom side electrode 8, which is separated from the active layer 3 by about 100 $\mu$m thick substrate 1. That is, the semiconductor laser is generally upside-down bonded on a heat sink by known low melting point solder such as indium metal. In such upside-down bonding, the TS type semiconductor laser has a problem that its top face, that is, the p-side electrode 7 in the example of FIG. 1 has a slightly terraced surface, since the substrate is of terraced shape. Accordingly, in the bonding process of the TS laser in the upside-down manner on a heat sink with the solder layer inbetween, because of non-flatness of the top face of the laser chip the solder is likely to be pushed out from the periphery of the semiconductor laser chip when pressing the semiconductor laser chip on the heat sink. And this pushed out solder is likely to creep up to the lower part of the peripheral section or side face of the semiconductor laser chip. Such creeping up on the side face is likely to cause short-circuiting of the p-n junction between the layers 3 and 4 of the laser chip, since the cap layer 5 in the thinner part (left half part in FIG. 1) is only about 1 $\mu$m. Actually, such short-circuiting very often has occurred in manufacturing the TS type laser than other type. In order to eliminate such problem, to increase thickness of the cap layer 5 has been examined thereby intending to obtain more flat upper face. But the increased thickness on n-GaAs layer 5 makes an accurate control of the diffusion depth of the Zn-diffused region 6 difficult, that is the control of the effective width of the current injection path becomes difficult.

SUMMARY OF THE INVENTION

The present invention purposes to eliminate the abovementioned problem. The present invention, by adopting an improved structure, can provide a flat top faced TS type semiconductor laser wherein the Zn diffusion is accurately controllable, and hence has a high manufacturing yield by overcoming the liability of short-circuiting at the peripheral side face of the p-n junction at the bonding of the laser chip onto the heat sink.

BRIEF DESCRIPTION OF THE DRAWING

FIG. 3(a), FIG. 3(b), FIG. 3(c), FIG. 3(d) and FIG. 3(e) are schematic sectional elevation views showing a manufacturing flow of a laser embodying the present invention, wherein FIG. 3(e) is a schematic sectional elevation view of the finished semiconductor laser in accordance with the present invention.

DETAILED DESCRIPTION OF THE PREFERRED EMBODIMENT

A semiconductor laser in accordance with the present invention comprises:

a terraced semiconductor substrate which has a thicker part and a thinner part with a step inbetween, semiconductor layers including an active layer formed on the terraced semiconductor substrate in a manner to have an inclined part ranging from the position above the step to the part shifted to the side of the thinner part, an overriding layer having the opposite conductivity type to that of the uppermost layer of the semiconductor layers and formed on the uppermost layer, characterized by further comprising:

a last layer having the same conductivity type to that of the overriding layer formed on the latter layer, the last layer having a stripe-shaped through-opening at the position which is a shifted position from the part immediately above said inclined part, thereby exposing a surface of the overriding layer at the bottom of the through-opening, and a conduction region formed at least on the bottom and side faces of the stripe-shaped opening, in a manner to reach and contact the uppermost layer.

Figure 2:
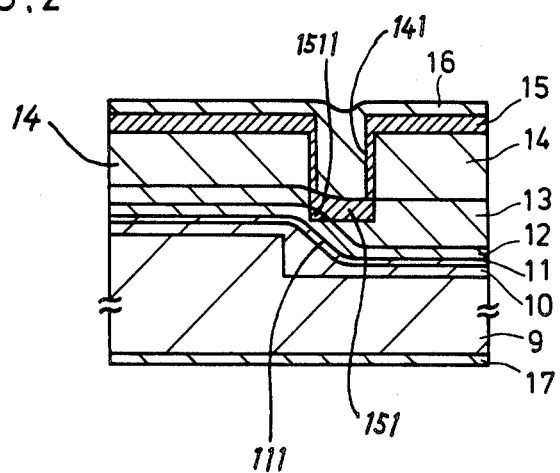
FIG. 2 is a schematic sectional elevation view of an example embodying the present invention.

An example semiconductor laser in accordance with the present invention is shown by a schematic elevation view of FIG. 2.

Figure 1:
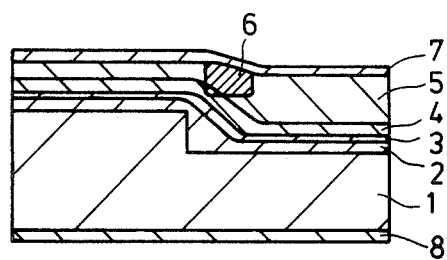
FIG. 1 is a schematic sectional elevation view of an example of an already proposed (but is now pending in patent applications in several countries and not yet disclosed nor published) TS type laser.

The structural feature of the laser in accordance with the present invention is, on the overriding layer 13, which corresponds to the cap layer 5 the structure of FIG. 1, the last layer 14 is formed, and the stripe-shaped through-opening 141 is formed in the last layer 14, and the conduction region 15 is formed in the through-opening 141 in a manner that the conduction region 15 at the bottom of the through-opening contacts the uppermost layer 12 at the part above the inclined lasing region 111.

That is, the device of FIG. 2 has a double-hetero structure formed by known liquid phase epitaxial growth, as shown in FIG. 1, which has on the terraced substrate 9 of ... n-GaAs
the first clad layer 10 of ... n-GaAlAs,
the active layer 11 of ... non-doped GaAlAs,
the second clad layer 12 of ... p-GaAlAs,
the overriding layer 13 of ... n-GaAs,
the last layer 14 of ... n-GaAlAs, wherethrough
the stripe-shaped through-opening 141 is formed and
the conduction region 15 of ... Zn-diffused p-GaAlAs in the inner face and on the exposed surface of the overriding layer 13. The position of the stripe-shaped through-opening 141 is selected such that the edge of the Zn-diffused region 151 intrude in or overlap the uppermost layer or the second clad layer 12 at the part above the inclined part, which is the lasing region 111, of the active layer 11.

By such construction, by thickly growing the last layer 14, (i) the surface of the overriding p-side electrode 16 can be made flat or of even surface, and furthermore, (ii) the thick last layer 14 can be used as a diffusion mask for forming the conduction region 15 by thermal diffusion process. When this last layer 14 is used as the diffusion mask, the thickness of the last layer should be so selected that the diffusion of Zn into and through the overriding layer 13 is made in a manner to allow one (left bottom in FIG. 2) edge of the diffusion front to penetrate through the overriding layer 13 and contact the second clad layer 12 but the other (right bottom in FIG. 2) edge of the diffusion front to remain in the overriding layer 13.

When a thin last layer 14 is requested, then the diffusion should be made after forming $SiO_2$ film on the upper face of the last layer 14, so that the $SiO_2$ film serves as a diffusion mask.

In the actual example, as elucidated hereinafter, by selecting that n-GaAs overriding layer 13 is 1 $\mu$m thick and n-GaAlAs last layer 14 is 2 to 3 $\mu$m thick, the surface of the last layer 14 becomes flat. By using the 2 to 3 $\mu$m thick last layer 14 as the diffusion mask, there is no need of using the $SiO_2$ film as the additional mask.

Now, referring to FIGS. 3(a), 3(b), 3(c), 3(d) and 3(e), showing manufacturing flow in accordance with the present invention, the manufacturing of the device of the present invention is elucidated in detail.

Figure 3A:
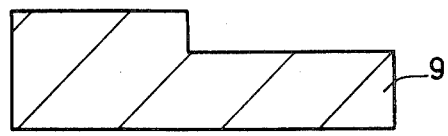
Figure 3B:
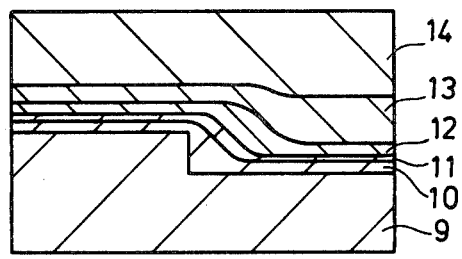

An n-conductivity type GaAs substrate 9 is etched in a manner that a 1.5 $\mu$m high step in the <011> direction is formed on the (100) principal face thereof as shown by FIG. 3(a). On the principal face of the substrate 9, by liquid phase sequential epitaxial growth method the following layers are formed:

the first clad layer 10 of ... n-$Ga_{0.65}Al_{0.35}As$,
  0.2 $\mu$m thick on the flat parts and
  1.0 $\mu$m thick at the step part, forming oblique surface,
the active layer 11 of ... non-doped $Ga_{0.95}Al_{0.05}As$,
  0.08 $\mu$m thick on the flat parts and
  0.2 $\mu$m thick on the oblique surface of the
  first clad layer 11, forming inclined lasing region 111,
the second clad layer 12 of ... p-$Ga_{0.65}Al_{0.35}As$,
  0.4 $\mu$m on the flat parts and
  1.5 $\mu$m on the inclined lasing region 111,
the overriding layer 13 of ... n-GaAs,
  1 $\mu$m thick above the thicker part of substrate 9,
  2.5 $\mu$m thick above the thinner part of substrate 9, and thereon
the last layer 14 of ... n-$Ga_{0.5}Al_{0.5}As$,
  2.5 $\mu$m thick is formed, as shown by FIG. 3(b).

Figure 3C:
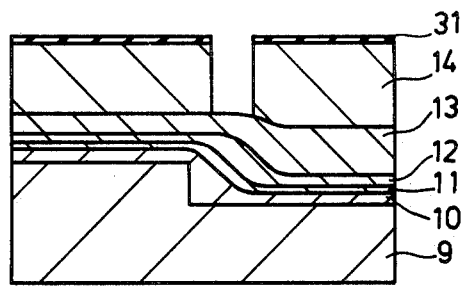
Figure 3D:
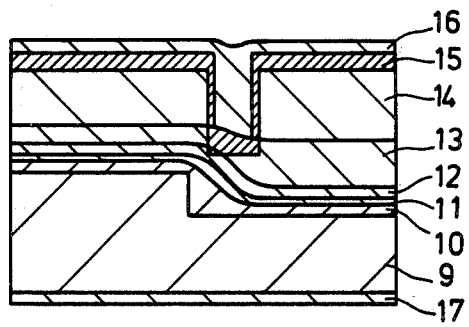

Then, a known photoresist film 31 is formed on the surface of the wafer. And by means of known photo-etching method using hydrochloric acid undiluted, an about 3 $\mu$m wide through-opening 141 is formed through the last layer 14, as shown by FIG. 3(c). The position of the opening 141 is above the position which is by 2 $\mu$m shifted from the position of the inclined lasing region 111 in the direction to the thinner part of the substrate 9. Since the composition of the overriding layer 13 of GaAs and the last layer 14 of GaAlAs is different, in the chemical etching process using the hydrochrolic acid undiluted the etching is made only in the lst layer 14 of GaAlAs, and stops upon exposuring the surface of the overriding layer 13 at the bottom of the etched through-opening 141. By using some measure of accurately stopping the etching at a desired depth, a single layer, for instance GaAs layer, instead of the composite double layers of GaAs 13 and GaAlAs 14 is usable. Then, after removing the photoresist 31 and selectively diffusing the impurity Zn on the exposed surface of the overriding layer 13, the p-type conduction layer 15 is formed at least at the bottom 151, and on the inner wall of the opening 141 and on the upper face of the last layer 14. The diffusion of the bottom part region 151 is so controlled that the conduction region 15 at the bottom of the through-opening contacts the uppermost layer 11 at the part above the inclined lasing region 111. Thereafter, p-side electrode 16 is formed by vapor deposition followed by a heat treatment. On the bottom face of the substrate 9, an n-side electrode 17 is formed with a thickness of about 0.5 μm, as shown by FIG. 3(d).

Then the semiconductor wafer is cleaved and mounted on a heat sink of a copper block 18 in an upsidedown way, that is the bonding the p-side electrode 16 on the copper block 18 by using indium. Then a fine gold wire 20 is bonded on the electrode 17 and the semiconductor laser is completed as shown by FIG. 3(e).

Figure 3E:
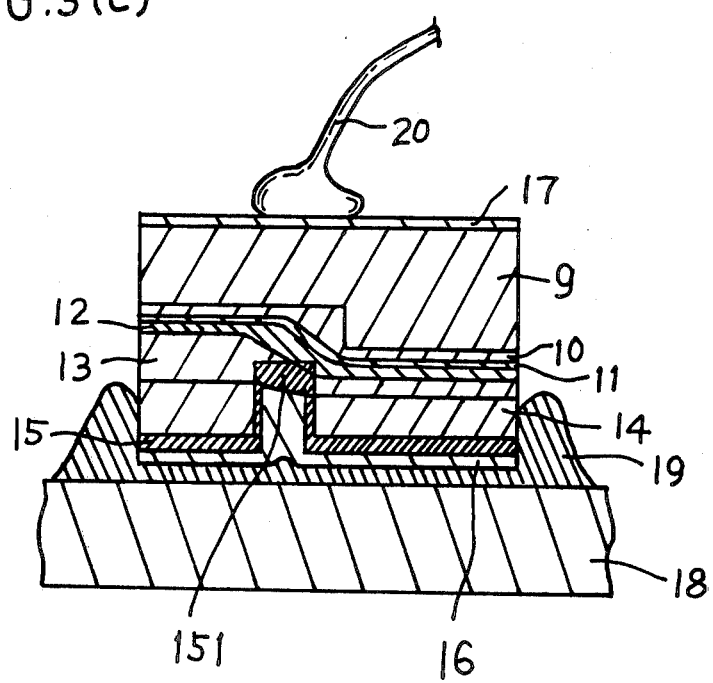

As is obviously observed from FIG. 3(e), the semiconductor laser in accordance with the present invention comprises last layer 14 of a considerable thickness, i.e., 2 to 3 μm of n-type GaAlAs layer on the overriding layer 13 (corresponding to generally called cap layer, for instance like in the example of FIG. 1), and therefore the solder 19 used for the bonding on the copper heat sink and pushed out around the peripheral side part of the semiconductor laser wafer does not creap up or reach the p-n junction between the second clad layer 12 of p-GaAlAs and the active layer 11 of n-GaAlAs. Therefore, the isolation or insulation of the p-n junction between the p-type layer 12 and the n-type layer 13 is satisfactorily secured, thereby eliminating short-circuits of the p-n junction. Therefore the path of the injected current is effectively limited through the conduction layer 15 and the contacting part 1511 thereof. By providing the abovementioned thick last layer 14, the top face to be bonded upside-down onto the heat sink 18 becomes very flat, and therefore the bonding becomes stable. By means of carrying out the diffusion through the opening 141, the control of the diffusion depth with respect to the face of the second clad layer 11 becomes very easy, accurate and stable.

As a result of the abovementioned improvements the manufacturing yield is very much improved.

What is claimed is:

1. In a semiconductor laser:
    a terraced semiconductor substrate (9) which has a thicker part and a thinner part with a step inbetween,
    semiconductor layers (10, 11, 12) including an active layer (11) formed on said terraced semiconductor substrate (9) in a manner to have an inclined part (111) ranging from the position above said step to the part shifted to the side of said thinner part,
    an overriding layer (13) having the opposite conductivity type to that of the uppermost layer (12) of said semiconductor layers (10, 11, 12) and formed on said uppermost layer (12),
    characterized by further comprising:
    a last layer (14) having the same conductivity type to that of the overriding layer (13) formed on the latter layer (13),
    said last layer (14) having a stripe-shaped through-opening (141) at the position which is a shifted position from the part immediately above said inclined part (111), thereby exposing a surface of said overriding layer (13) at the bottom of the through-opening (141),
    a conduction region (15) formed at least on the bottom and side faces of said stripe-shaped opening, in a manner to reach and contact said uppermost layer (12),
    a first electrode layer formed to contact to said conduction layer in said through-opening and
    a second electrode formed on the bottom face of said terraced semiconductor substrate.

2. A semiconductor laser in accordance with claim 1, wherein said first electrode (16) is bonded by a solder onto a heat sink (18).

3. A semiconductor laser in accordance with claim 1, wherein said second clad layer (12) is GaAlAs.

4. A semiconductor laser in accordance with claim 1, wherein said overriding layer (13) and said last layer (14) has different composition.

5. A semiconductor laser in accordance with claim 1, wherein said conduction layer (15) is a Zn diffused region.

6. A semiconductor laser in accordance with claim 1, wherein said active layer is GaAlAs.

7. A semiconductor laser in accordance with claim 1, wherein said substrate is GaAs.

8. A semiconductor laser in accordance with claim 1, wherein said second electrode has a wire bonded thereto.

9. A semiconductor laser in accordance with claim 2, wherein said solder is a low temperature metal and said heat sink is of copper.

10. A semiconductor laser in accordance with claim 4, wherein said overriding layer is GaAs and said last layer is GaAlAs.

* * * * *